(12) United States Patent
Cho et al.

(10) Patent No.: US 10,585,226 B2
(45) Date of Patent: Mar. 10, 2020

(54) LIGHT CONVERSION DEVICE, MANUFACTURING METHOD THEREOF, LIGHT SOURCE MODULE INCLUDING LIGHT CONVERSION DEVICE AND BACKLIGHT UNIT INCLUDING THE SAME

(71) Applicant: SAMSUNG ELECTRONICS CO., LTD., Suwon-si, Gyeonggi-do (KR)

(72) Inventors: Oul Cho, Suwon-si (KR); Eun Joo Jang, Suwon-si (KR); Hyun A Kang, Suwon-si (KR); Tae Hyung Kim, Seoul (KR); Jeong Hee Lee, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 25 days.

(21) Appl. No.: 15/471,033

(22) Filed: Mar. 28, 2017

(65) Prior Publication Data

US 2017/0329068 A1 Nov. 16, 2017

(30) Foreign Application Priority Data

May 11, 2016 (KR) .......................... 10-2016-0057495

(51) Int. Cl.
*F21V 8/00* (2006.01)
*H01L 33/50* (2010.01)

(52) U.S. Cl.
CPC .......... *G02B 6/0026* (2013.01); *H01L 33/502* (2013.01); *H01L 33/507* (2013.01)

(58) Field of Classification Search
CPC .... G02B 6/0026; H01L 33/502; H01L 33/507
See application file for complete search history.

(56) References Cited

U.S. PATENT DOCUMENTS

| 6,517,213 | B1 * | 2/2003 | Fujita | ...................... G09F 13/04 |
| | | | | 362/23.18 |
| 8,052,320 | B2 * | 11/2011 | Hamada | ............... G02B 6/0026 |
| | | | | 362/231 |

(Continued)

FOREIGN PATENT DOCUMENTS

| JP | 2013033833 A | 2/2013 |
| JP | 2016071341 A | 5/2016 |

(Continued)

OTHER PUBLICATIONS

European Search Report for European Patent Application No. 17168234.7 dated Jul. 18, 2017.

*Primary Examiner* — Arman B Fallahkhair
(74) *Attorney, Agent, or Firm* — Cantor Colburn LLP

(57) ABSTRACT

A light conversion device includes a frame through which incident light is received from a light source and converted light is emitted from the light conversion device, the frame including: an opening through which light of a first color is received from the light source and from which light of a second color is emitted from the light conversion device, and a wall which surrounds the opening, a substrate in the opening and supported by the wall, a light conversion layer which is disposed on the substrate and receives the light of the first color from the light source, the light conversion layer including a light converting particle which converts the light of the first color to the light of the second color, a first inorganic layer disposed on the light conversion layer, and a first organic layer disposed on the first inorganic layer.

27 Claims, 14 Drawing Sheets

(56) References Cited

U.S. PATENT DOCUMENTS

| | | | |
|---|---|---|---|
| 8,115,217 B2* | 2/2012 | Duong | H01L 33/20 |
| | | | 257/88 |
| 8,262,257 B2* | 9/2012 | Deeben | H01L 33/508 |
| | | | 362/249.02 |
| 8,567,974 B2* | 10/2013 | Hoelen | C09K 11/7774 |
| | | | 362/84 |
| 9,085,728 B2 | 7/2015 | Uchida et al. | |
| 9,362,462 B2* | 6/2016 | Park | H01L 33/507 |
| 9,366,414 B2* | 6/2016 | Takahashi | F21V 9/16 |
| 2012/0113672 A1* | 5/2012 | Dubrow | B82Y 20/00 |
| | | | 362/602 |
| 2013/0148376 A1 | 6/2013 | Nick et al. | |
| 2013/0207073 A1 | 8/2013 | Bawendi et al. | |
| 2014/0346547 A1 | 11/2014 | Park | |
| 2015/0049491 A1 | 2/2015 | Venkataraman et al. | |
| 2015/0083970 A1 | 3/2015 | Koh et al. | |
| 2015/0137163 A1* | 5/2015 | Harris | H01L 33/483 |
| | | | 257/98 |
| 2015/0219822 A1 | 8/2015 | Lee et al. | |
| 2015/0226905 A1 | 8/2015 | Yoon et al. | |
| 2015/0362654 A1 | 12/2015 | Sadasivan et al. | |
| 2016/0268488 A1* | 9/2016 | Goeoetz | C09K 11/7774 |
| 2017/0192146 A1* | 7/2017 | Yamada | G02B 6/005 |

FOREIGN PATENT DOCUMENTS

| | | |
|---|---|---|
| KR | 1020150093890 A | 8/2015 |
| WO | 2015063077 A1 | 5/2015 |

\* cited by examiner

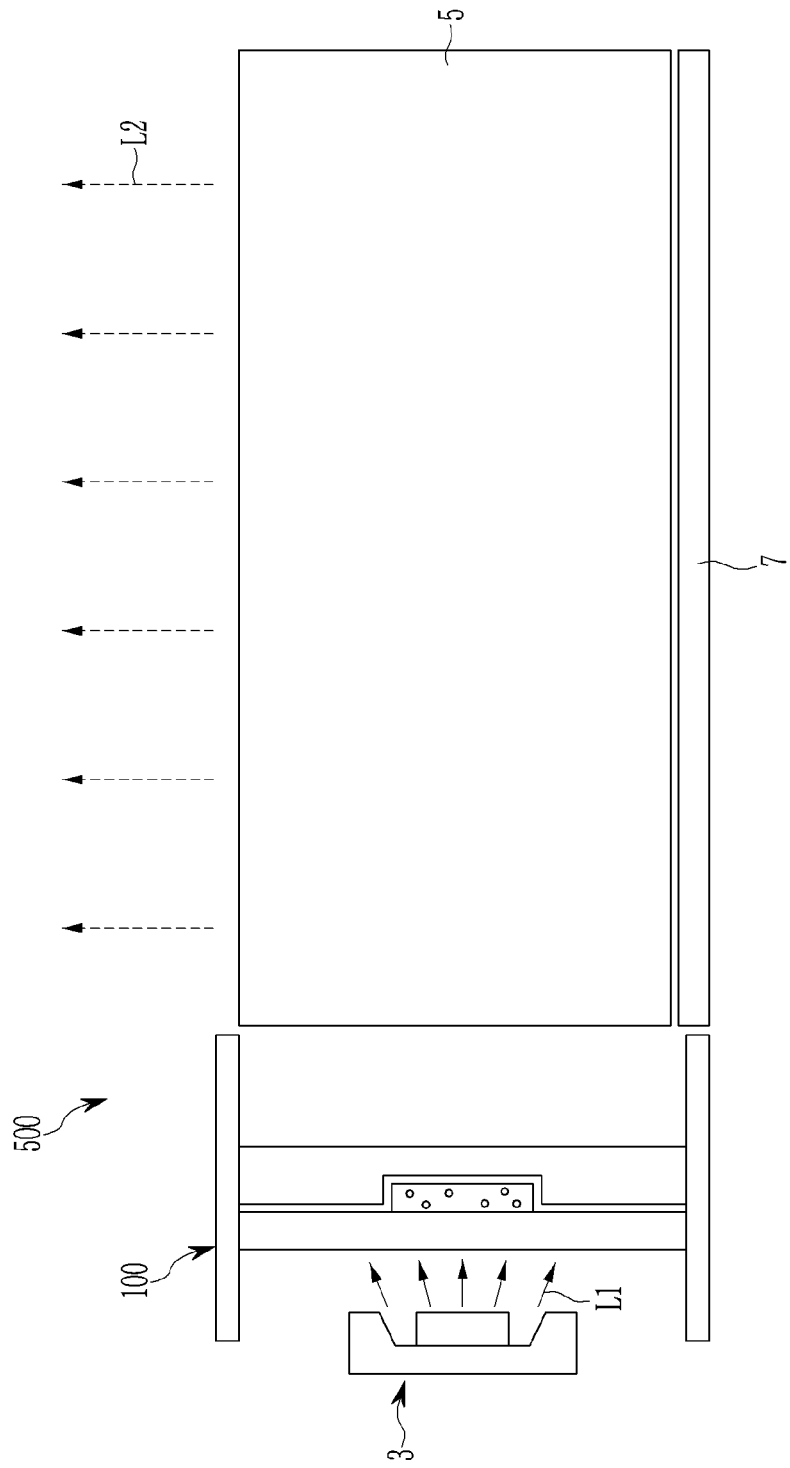

LIGHT CONVERSION DEVICE, MANUFACTURING METHOD THEREOF, LIGHT SOURCE MODULE INCLUDING LIGHT CONVERSION DEVICE AND BACKLIGHT UNIT INCLUDING THE SAME

CROSS-REFERENCE TO RELATED APPLICATION

This application claims priority to Korean Patent Application No. 10-2016-0057495 filed on May 11, 2016, and all the benefits accruing therefrom under 35 U.S.C. § 119, the content of which in its entirety is incorporated herein by reference.

BACKGROUND

1. Field

A light conversion device, a manufacturing method thereof, a light source module including the light conversion device and a backlight unit including the same are disclosed.

2. Description of the Related Art

A quantum dot is a nanocrystal semiconductor material having a diameter of less than or equal to around 10 nanometers (nm), which shows quantum confinement effects. The quantum dot generates stronger light in a relatively narrow light wavelength range than a phosphor. The quantum dot emits light by an excited electron being transitioned from a conduction band to a valance band and has characteristics that a wavelength thereof is changed depending upon a particle size even in the same quantum dot material. As a quantum dot emits light in a wavelength range according to a particle size of the quantum dot, light may be emitted in a desirable wavelength range by adjusting the size of the particle of the quantum dot.

The quantum dot is maintained in a relatively natural state thereof, dispersed in an organic solvent. However, when the quantum dot is exposed to oxygen or moisture, the luminous efficiency thereof may be reduced. To not reduce luminous efficiency, a resin dispersed with the quantum dots is disposed in a glass container such as a tube or capillary to maintain a natural state of the quantum dots.

SUMMARY

Provided are a light conversion device having all excellent durability, oxygen or moisture blocking property, formability and photo-efficiency; a light source module and a backlight unit including the same; and a method of manufacturing the light conversion device having excellent processability and mass-productivity.

According to an embodiment, a light conversion device includes a frame through which incident light is received from a light source and converted light is emitted from the light conversion device, the frame including: an opening which is open in a first direction, through which light of a first color is received from the light source and from which light of a second color different from the first color is emitted from the light conversion device, and a wall which surrounds the opening to define the opening, a substrate in the opening and supported by the wall which surrounds the opening, a light conversion layer which is disposed on the substrate and receives the light of the first color from the light source, the light conversion layer including a light converting particle which converts the light of the first color to the light of the second color, a first inorganic layer disposed on the light conversion layer, and a first organic layer disposed on the first inorganic layer.

At least one of the first inorganic layer and the first organic layer may contact the wall to seal the light conversion layer.

The first inorganic layer may include silicon oxide, silicon nitride, aluminum oxide, titanium oxide, indium oxide, tin oxide, indium tin oxide, tantalum oxide, zirconium oxide, niobium oxide or combination thereof.

The first organic layer may include a thiol-ene polymer, an organic silicone polymer, a vinyl polymer, polyimide, polyethylenenaphthalate, polyethyleneterephthalate, polyarylate, polycarbonate, epoxy, polyetherimide, polyethylene, polyacrylate, polyethersulfone, or a combination thereof.

The light conversion device may further include a second organic layer between the light conversion layer and the first inorganic layer.

The second organic layer may contact the wall to seal the light conversion layer.

The second organic layer may include a thiol-ene polymer, an organic silicone polymer, a vinyl polymer, polyimide, polyethylenenaphthalate, polyethyleneterephthalate, polyarylate, polycarbonate, epoxy, polyetherimide, polyethylene, polyacrylate, polyethersulfone, or a combination thereof.

The substrate may define a concave portion thereof recessed from an upper surface of the substrate, and the light conversion layer may be disposed in the concave portion of the substrate.

The light conversion device may further include a second inorganic layer disposed in the concave portion of the substrate and between the substrate and the light conversion layer in the concave portion of the substrate.

The second inorganic layer disposed in the concave portion of the substrate may extend onto the upper surface of the substrate and contact the wall to seal the light conversion layer on the substrate.

The second inorganic layer may include silicon oxide, silicon nitride, aluminum oxide, titanium oxide, indium oxide, tin oxide, indium tin oxide, tantalum oxide, zirconium oxide, niobium oxide or a combination thereof.

The substrate may be disposed in a plane which is perpendicular to the first direction in which the opening of the frame is open.

The frame may include a metal, a polyolefin, a polyester, a polyimide, a polycarbonate, a polyethersulfone, a polyethyleneterephthalate, a polyethylene, a polycarbonate, a polyurethane, a polypropylene, an acrylonitrile-butadiene-styrene polymer, a polystyrene, or a combination thereof.

The frame may include a light reflection layer having light reflectance of greater than or equal to about 70% disposed on an inner surface of the wall which faces the opening of the frame.

The light converting particle may be quantum dot which may include a Group II-VI compound, a Group III-V compound, a Group IV-VI compound, a Group IV compound or a combination thereof.

The light conversion device may further include a transparent layer under the substrate.

A thickness of the transparent layer may range from about 0.1 millimeter (mm) to about 5 millimeters (mm).

The light conversion device may further include a cover layer disposed on the first organic layer.

The frame may define a length thereof in a second direction perpendicular to the first direction in which the opening is open, the opening may be provided in plurality in the frame, and the plurality of openings may be disposed along the length of the frame.

The length of the frame may linearly be extended in the second direction or may be curved with respect to the second direction.

According to another embodiment, a method of manufacturing a light conversion device includes preparing a frame through which incident light is received from a light source and converted light is emitted from the light conversion device, the frame including: an opening which is open in a first direction, through which light of a first color is received from the light source and from which light of a second color different from the first color is emitted from the light conversion device, and a wall which surrounds the opening to define the opening, disposing a light conversion layer which receives the light of the first color from the light source, on a substrate, the light conversion layer including a light converting particle which converts the light of the first color to the light of the second color, inserting the substrate into the frame through the opening thereof and fixing the inserted substrate to the wall of the frame which surrounds the opening, forming a first inorganic layer on the light conversion layer, and forming a first organic layer on the first inorganic layer.

The fixing of the substrate to the wall of the frame may include disposing the substrate in a plane perpendicular to the first direction in which the opening of the frame is open.

The forming of the light conversion layer may include disposing a light converting particle material on the substrate and curing the light converting particle material to form the light conversion layer including the light converting particle on the substrate.

According to another embodiment, a light source module includes a light source which generates and emits light of a first color, and a light conversion device described above which is disposed in a light emission direction of the light source, converts the light of the first color to light of a second color different from the first color, and emits the light of the second color.

The light source may emit blue light as the light of the first color, and the light conversion device may convert the blue light into white light as the light of the second color different from the first color.

According to another embodiment, a backlight unit includes a light source module which generates and emits converted light; and a light guide which receives the converted light from the light source module and guides the received converted light to be emitted from the backlight unit to a display which generates an image with the emitted light. The light source module includes: a light source which generates and emits light of a first color, and a light conversion device described above which is disposed in a light emission direction of the light source, converts the light of the first color to light of a second color different from the first color, and emits the light of the second color.

The light conversion device according to one or more embodiment may have improved durability, oxygen or moisture blocking properties, formability and photo-efficiency.

In addition, one or more embodiment described above may provide a method of fabricating a light conversion device through a relatively simple process to have excellent mass productivity of the light conversion device.

In addition, one or more embodiment described above may provide a light source module and a backlight unit including the light conversion device.

BRIEF DESCRIPTION OF THE DRAWINGS

The above and other advantages and features of this disclosure will become more apparent by describing in further detail embodiments thereof with reference to the accompanying drawings, in which:

FIG. 13 is a cross-sectional view showing a backlight unit including a light source module including a light conversion device according to an embodiment.

DETAILED DESCRIPTION

Figure 1:
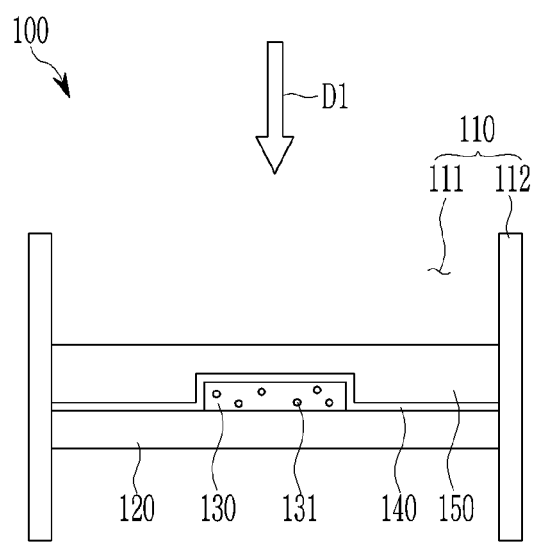
FIG. 1 is a cross-sectional view of a light conversion device according to an embodiment.

Embodiments of the present disclosure will hereinafter be described in detail, and may be easily performed by those who have common knowledge in the related art. However, this disclosure may be embodied in many different forms, and is not to be construed as limited to the embodiments set forth herein.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

To dispose quantum dots in a glass container or enclosure for use in a light conversion device, injecting quantum dots-dispersed resin into an inlet of the glass container having a diameter of only several millimeters may be difficult. Furthermore, with the quantum dots-dispersed resin injected in the glass container, the volume of the injected resin may be expanded on curing the injected resin or a gas may be generated therein, causing cracks in the glass container. In addition, as having a fixed material (e.g., inflexible or difficult to process) shape, the glass container has relatively low durability and formability due to brittleness thereof, such that the glass container is easily damaged during the delivery or the usage thereof. Moreover, forming the glass container into a shape may be difficult.

Accordingly, developing a light conversion device in which quantum dots are disposed in a container and having excellent durability, an oxygen or moisture blocking property, deformability and photo-efficiency is desired.

In one or more embodiment described hereafter, a "light conversion device" refers to a device which converts incident light thereto to light having a specific color which may be different from that of the incident light, and emits the specific color light.

First, referring to FIG. 1, a schematic structure of a light conversion device according to an embodiment is described.

FIG. 1 is a cross-sectional view of a light conversion device according to an embodiment.

Referring to FIG. 1, a light conversion device 100 includes a frame 110, a substrate 120, a light conversion layer 130, a first inorganic layer 140 and a first organic layer 150.

Incident light is received from a light source through the frame 110 and converted light is emitted from the light conversion device 100 through the frame 110. The light conversion device 100 according to an embodiment provides the frame 110 including and/or defining a penetration portion 111 in a first direction D1 and a wall 112 which surrounds the penetration portion 111. The wall 112 may include plural portions thereof each defining a length thereof larger than a width thereof. Lengths of the plural wall portions may extend in a length direction of the frame 110 and a width direction of the frame 110. The penetration portion 111 may be defined by and between wall portions to be open in the first direction D1 and/or a direction opposite thereto, when nothing is disposed within the penetration portion 111. The penetration portion 111 may be a continuous opening defined by the wall 112 of the frame 110.

In addition, in the frame 110, the substrate 120 is supported by the wall 112, and the light conversion layer 130 including quantum dots 131 is positioned on the substrate 120. The penetration portion 111 is an opening defined by the frame 110, which exposes an inner area of the frame 100 outside thereof. The penetration portion 111 may be open in both the first direction D1 and a direction opposite to D1, from the inner area of the frame 110.

A first inorganic layer 140 and a first organic layer 150 are sequentially disposed or formed on the light conversion layer 130. The first inorganic layer 140 covers an entirety of the upper surface and an entirety of side surfaces of the light conversion layer 130 such that the light conversion layer 130 is not exposed to an outside thereof.

According to an embodiment, at least one of the first inorganic layer 140 and the first organic layer 150 contacts the wall 112 to seal the light conversion layer 130 such that the light conversion layer 130 is not exposed to an outside thereof. The first inorganic layer 140 and the first organic layer 150 may directly contact the wall 112. That is, by removing a gap between the wall and the first inorganic layer 140 or the first organic layer 150, penetration of oxygen or moisture which deteriorates the luminous efficiency of the light conversion layer 130 through a gap, may be reduced or effectively prevented.

Among the various methods of minimizing the optical property deterioration of the light conversion layer including quantum dots, a glass capillary (container or tube) type light conversion device is fabricated by disposing a quantum dot-including resin into a glass container or tube and then sealing the same such that the quantum dot-including resin is not exposed to outside the glass container or tube.

The process of disposing the quantum dot-including resin into an inlet having a diameter of several micrometers to several millimeters is difficult due to complicated conditions such as a resin viscosity, a speed at which the resin is disposed into the glass container, a preliminarily removal of moisture or gas in the glass container, maintaining vacuum atmosphere during the disposing of the resin in the glass container, etc., and the like. In addition, according to the characteristics of the glass container, the volume of disposed resin may be expanded on curing the resin disposed therein, or gas may be generated in the glass container, causing cracks in the glass container, so a defect rate may be unfavorably increased in a following curing process.

However, the light conversion device 100 according to one or more embodiment may be easily fabricated, compared to the glass capillary type light conversion device, by disposing a substrate 120 including or formed with a light conversion layer 130 in the frame 110 having or defining a penetrating portion 111 opened in a first direction D1, and sequentially stacking a first inorganic layer 140 and a first organic layer 150 on the light conversion layer 130 to seal the light conversion layer 130 within the frame 110.

In addition, as a barrier layer for sealing the light conversion layer 130, the first inorganic layer 140 and the first organic layer 150 are sequentially stacked on the light conversion layer 130 to provide a higher durability and stability than a barrier of the glass capillary type light conversion device including a glass container or tube which has a relatively strong brittleness.

Hereinafter, referring to FIGS. 1 to 3, a structure of a light conversion device according to various embodiments is described.

Figure 2:
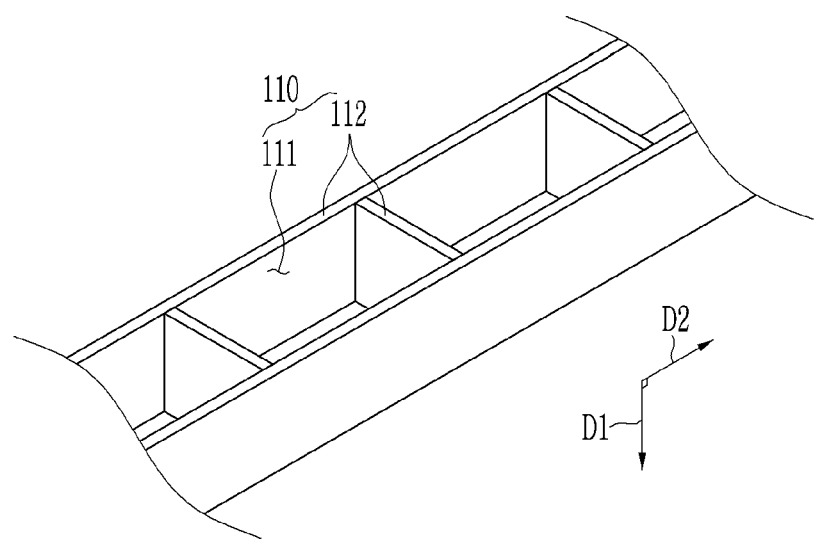
FIGS. 2 and 3 are respectively perspective views of frames of a light conversion device according to embodiments.
Figure 3:
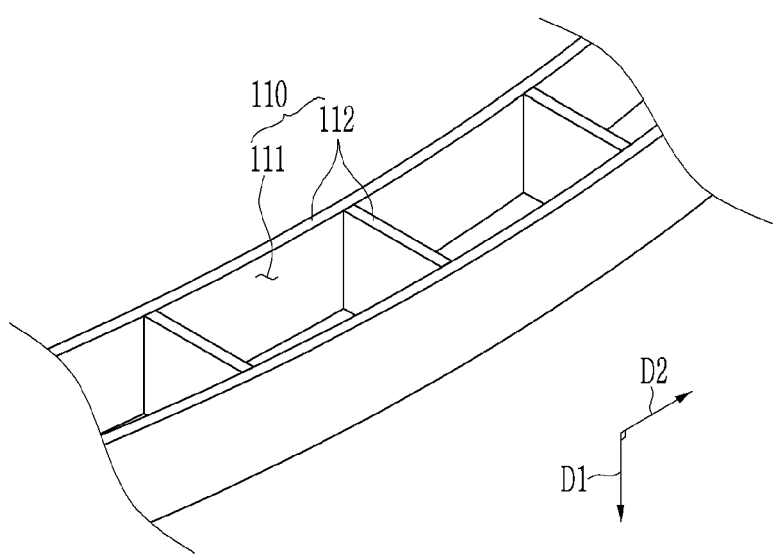

FIG. 2 is a perspective view showing an example of a frame of a light conversion device according to an embodiment, and FIG. 3 is a perspective view of another example of a frame of a light conversion device according to an embodiment, different from that of FIG. 2.

In a top plan or perspective view, the frame 110 defines a length thereof which is larger than a width thereof. The frame 110 according to an embodiment may be lengthwise extended along a second direction D2 perpendicular to the first direction D1. A depth of the frame 110 is taken in the first direction D1. That is, the appearance of the frame 110 may have a strip shape. However, embodiments are not necessarily limited thereto, but may have the various appearances such as quadrangle, square or oval. Referring to FIGS. 2 and 3, a width of the frame 110 may be taken in a direction (not labeled) perpendicular to both the first and second directions D1 and D2. Referring to FIGS. 2 and 3, a width of the frame 110 may be defined in a direction in which the smaller wall portions of the wall 112 are lengthwise extended.

At least two penetration portions 111 may be provided in a frame 110, and as shown in FIGS. 2 and 3, at least two penetration portions 111 may be disposed in row along a length direction (D2) of the frame 110. According to an embodiment, the penetration portions 111 may be disposed in only a single row along the length direction of the frame 110 as shown in FIGS. 2 and 3. However, the embodiment is not limited thereto, and the penetration portions 111 may be disposed in at least two rows adjacent to each other in a width direction of the frame 110.

In the light conversion device 100 according to an embodiment, a light converter collectively including a substrate 120, a light conversion layer 130, a first inorganic layer 140 and a first organic layer 150 may be disposed in every penetration portion 111. The light converter is disposed in the frame 110 while being not protruded to the outside of the frame 110. Thereby, the appearance of the frame 110 may correspond to or define the overall outer shape of the light conversion device 100 according to an embodiment.

The frame 110 may include or be made of a metal or a polymer material. In an embodiment, for example, the frame 110 may include a metal, a polyolefin, a polyester, a polyimide, a polycarbonate, a polyethersulfone, a polyethylene terephthalate, a polyethylene, a polycarbonate, a polyurethane, a polypropylene, an acrylonitrile-butadiene-styrene polymer, a polystyrene or a combination thereof.

When the frame 110 includes or is made of the material, the frame 110 has improved formability compared with a glass container body of the glass capillary type light conversion device, and thus the frame 110 may be relatively easily formed into a desired shape.

That is, the exterior shape of the frame 110 may be linearly extended (e.g., non-curved) in a length direction (second direction D2) thereof perpendicular to the first direction D1 (refer to FIG. 2) or may be slightly curved in the second direction D2 (refer to FIG. 3). That is, the frame 110 may be formed to have various shapes of a straight strip, a curved strip and the like.

Thereby, applying the light conversion device 100 according to one or more embodiment to display devices having various shapes, for example, a curved display such as curved monitor or television ("TV"), a portable device such as smart watch, and the like, besides the conventional flat panel display, may be relatively easy. One or more embodiment of the light conversion device generates light which is provided to a display panel of the display which generates and displays and generates an image with the light from the light conversion unit.

When the frame 110 includes or is made of metal, the frame 110 has excellent thermal conductivity, so the heat generated in the light conversion device 100 may be discharged to the outside thereof. That is, when the frame 110 includes or is made of metal the heat-dissipation properties of a light conversion device 100 may be improved.

According to an embodiment, the substrate 120 is inserted in the penetration portion 111 and is also supported by a wall 112, such that no portion of the substrate 120 extends outside of the frame 110. The substrate 120 may be inserted and fixed in the penetration portion 111 such that a position of the substrate 120 is maintained in the frame 110.

The substrate 120 may be disposed in a plane substantially perpendicular to the first direction D1 and fixed at such position, as shown in FIG. 1. However, an embodiment is not limited thereto, and a plane in which the substrate 120 is disposed may be at a disposition angle according to the direction of incident light thereto and a direction to which converted light is to be emitted.

The substrate 120 may be disposed in the frame 110 such as to leave a space in several ten micrometers to several ten millimeters taken from the lowermost part of the frame 110. In an embodiment, for example, a gap between a lowest surface the substrate 120 in the first direction D1 and a lowest distal end of the wall 112 of the frame 110 in the first direction D1 may be, for example, greater than or equal to about 50 micrometers (μm), for example, greater than or equal to about 80 μm, for example, greater than or equal to about 0.1 millimeter (mm), for example, greater than or equal to about 1 mm and, for example, less than or equal to about 20 mm, for example, less than or equal to about 10 mm, for example, less than or equal to about 5 mm, for example, less than or equal to about 2 mm. The gap may be a maximum distance between the lowest surface the substrate 120 in the first direction D1 and a lowest distal end of the wall 112 of the frame 110 in the first direction D1. The substrate 120 may be exposed to outside the light conversion device 100 at the lower side of the light conversion device 100, while the first organic layer 150 may be exposed at the upper side of the light conversion device 100.

By leaving the gap between the substrate 120 and a distal end the frame 110 within the above-described ranges, a refraction degree and a refraction direction of light entering from the lowermost part of the frame 110 to the substrate 120 may be controlled. That is, by adjusting the refractive index between the substrate 120 and the lowermost part of the frame 110 through the gap, the light is guided from outside the frame 110 to be entered into the light conversion layer 130, so that the photo-efficiency of the light conversion device 100 may be improved.

The substrate 120 includes or is made of a material including glass, a metal oxide, a polymer, or a combination thereof, and is optically transparent. A material of the substrate 120 may be, for example, glass, a metal oxide, polyolefin, polyester, polyimide, polycarbonate, polyethersulfone, thiol-ene polymer, a cross-linked or uncross-linked (meth)acrylate polymer, a melamine(meth)acrylate polymer, polyepoxy, an epoxy(meth)acrylate polymer, an organic silicone polymer, a silicon(meth)acrylate polymer, a polyurethane(meth)acrylate polymer, a vinyl polymer, or a combination thereof. The thiol-ene polymer refers to a polymerization product of a monomer combination including a first monomer having at least two thiol group (—SH) at the terminal end and a second monomer having at least two carbon-carbon unsaturated bonds at the terminal end.

When the substrate 120 includes or is formed by a polymer material, a light dispersing particle (not shown) may be further included therein.

The substrate 120 may have a monolayer structure including or made of the above-described materials or may have a multilayer structure of at least two layers in which at least two different materials among the above-described materials are stacked. When the substrate 120 has the multilayer structure, at least two layers of different materials may be alternatively stacked at least one time. However, the substrate 120 structure is not necessarily limited thereto, but may be changed according to the gap distance between the substrate 120 and the lowermost part of the frame 110, the specific materials of the substrate 120, the kind of incident light, the color of incident light, and the like.

The light conversion layer 130 is disposed on the substrate 120. The light conversion layer 130 may be disposed or formed covering a part of an upper surface of the substrate 120 as shown in FIG. 1. The light conversion layer 130 exposes a portion of the upper surface of the substrate 120. Thereby, a first inorganic layer 140 and a first organic layer 150 that will be described later cover the light conversion layer 130 and easily seal the same. The first inorganic layer 140 and the first organic layer 150 are disposed on the exposed portion of the upper surface of the substrate 120 to seal the light conversion layer 130. However, the embodiment is not limited thereto, and the light conversion layer 130 may be disposed or formed to cover the entire surface of the substrate 120. The first inorganic layer 140 may directly contact the exposed portion of the substrate 120.

In an embodiment of manufacturing a light conversion device, the light conversion layer 130 may be formed by coating a resin material in which at least two quantum dots 131 as a light emitter are dispersed, on a substrate 120, and then curing the same.

Because the quantum dots 131 have a discontinuous energy bandgap due to a quantum confinement effect, the quantum dots 131 receives incident light thereto and emit radiation light within a certain wavelength range. Accordingly, a light conversion device 100 including the quantum dots 131 in a light conversion layer 130 may emit light having improved color reproducibility and color purity.

In an embodiment, a material of the quantum dot 131 is not particularly limited. In an embodiment, for example, the quantum dot may include a Group II-VI compound, a Group III-V compound, a Group IV-VI compound, a Group IV compound or a combination thereof.

The Group II-VI compound may be selected from a binary element compound selected from CdSe, CdTe, ZnS, ZnSe, ZnTe, ZnO, HgS, HgSe, HgTe, MgSe, MgS, and a combination thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from a binary element compound selected from GaN, GaP, GaAs, GaSb, AlN, AlP, AlAs, AlSb, InN, InP, InAs, InSb, and a combination thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound may be selected from a binary element compound selected from SnS, SnSe, SnTe, PbS, PbSe, PbTe, and a combination thereof; a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

The Group IV compound may include a single-element compound selected from Si, Ge, and a combination thereof; and a binary element compound selected from SiC, SiGe, and a combination thereof.

The binary element compound, the ternary element compound or the quaternary element compound respectively exist in a uniform concentration in the quantum dot particle or partially different concentrations in the same particle. The quantum dot may have a core-shell structure where one quantum dot 131 surrounds another quantum dot 131. The core and shell may have or define an interface therebetween, and an element of at least one of the core or the shell in the interface may have a concentration gradient where the concentration of the element(s) of the shell decreases toward the core. In addition, the quantum dot 131 may have one core of a quantum dot and multiple shells surrounding the core. The multi-shell structure has at least two shells where each shell may be a single composition, an alloy, or a composition having a concentration gradient.

In the quantum dot 131, the materials of the shell may have a relatively larger energy bandgap than that of the core, and thereby the quantum dot may exhibit a quantum confinement effect more effectively. For a multi-shell type, the bandgap of the material of an outer shell may be a relatively higher energy than that of the material of an inner shell that is closer to the core. In this case, the quantum dot 131 may emit light of a wavelength ranging from ultraviolet ("UV") light to infrared light.

The quantum dot 131 may have quantum efficiency of greater than or equal to about 10%, for example, greater than or equal to about 30%, greater than or equal to about 50%, greater than or equal to about 60%, greater than or equal to about 70%, or greater than or equal to about 90%.

At least two quantum dots 131 may be formed of the same materials as each other or different materials from each other. At least two quantum dots 131 may have the same size as each other or a different from one another.

In an embodiment, when incident light is blue light, at least two quantum dots 131 may include a green quantum dot to convert at least blue light into green light and a red quantum dot to convert at least blue light into red light. Thereby, the light finally emitted from the light conversion device 100 according to an embodiment may be adjusted to be white light which is a color mixture of blue light, green light and red light.

However, in an embodiment, the light emitter is not necessarily limited to quantum dot, and the kind of quantum dot is not limited to green quantum dot and red quantum dot.

In an embodiment, for example, the light conversion layer 130 according to an embodiment may emit white light by associating green quantum dots and a red phosphor or associating red quantum dots and a green phosphor. In addition, the light conversion layer 130 may also include phosphors respectively or collectively emitting each of magenta, cyan or yellow, besides quantum dots.

The first inorganic layer 140 closely contacts the surface of the light conversion layer 130 and also covers an entirety of the upper surface and side surfaces of the light conversion layer 130, which is optically transparent. The first inorganic layer 140 may directly contact the entirety of the upper surface and side surfaces of the light conversion layer 130. According to an embodiment, the first inorganic layer 140 contacts the wall 112 of the frame 110 while not leaving a gap between the wall 112 and the first inorganic layer 140, so as to play a role of sealing the light conversion layer 130.

The first inorganic layer 140 may include or be made of an inorganic material including a silicon oxide, a silicon nitride, an aluminum oxide, a titanium oxide, an indium oxide, a tin oxide, an indium tin oxide, a tantalum oxide, a zirconium oxide, a niobium oxide or a combination thereof.

In an embodiment of manufacturing a light conversion device, the first inorganic layer 140 may be obtained by a sputtering or a chemical vapor deposition ("CVD"), a solution process for which an inorganic material solution including silicon oxide, titanium oxide is covered on the substrate, and the like.

In an embodiment, the first inorganic layer 140 may have a water vapor transmission rate ("WVTR"), for example less than or equal to about 10 g/m²·day·atm, less than or equal to about 6 g/m²·day·atm, less than or equal to about 2 g/m²·day·atm, or less than or equal to about 1 g/m²·day·atm. That is, the first inorganic layer 140 has excellent moisture and water blocking properties, so deterioration of the luminous efficiency by extraneous oxygen or moisture incident to the light conversion layer 130 may be reduced or effectively prevented.

The first organic layer 150 is disposed or formed on the first inorganic layer 140 and is optically transparent. In an embodiment of manufacturing a light conversion device, the first organic layer 150 may be obtained by a solution process for which an organic material solution is covered on the first inorganic layer 140, and the like. The first organic layer 150 closely contacts the surface of the first inorganic layer 140 while covering and protecting the first inorganic layer 140, so that physical or chemical damage of the first inorganic layer 140 and the light conversion layer 130 may be reduced or effectively prevented. The first organic layer 150 may directly contact the surface of the first inorganic layer 140.

In an embodiment, the first organic layer 150 contacts the wall 112 of the frame 110 so as to not generate a gap between the wall 112 and the first organic layer 150, such that the light conversion layer 130 may be sealed and simultaneously, the first inorganic layer 140 may be protected.

In an embodiment, the first organic layer 150 may include or be made of an organic material including a thiol-ene polymer, an organic silicone polymer, a vinyl polymer, polyimide, polyethylenenaphthalate, polyethyleneterephthalate, polyarylate, polycarbonate, epoxy, polyetherimide, polyethylene, polyacrylate, polyethersulfone, or a combination thereof.

The thiol-ene polymer refers to a polymerization product of a monomer combination including a first monomer having at least two thiol group (—SH) at the terminal end and a second monomer having at least two carbon-carbon unsaturated bonds at the terminal end.

According to an embodiment, the first organic layer 150 may have or define a planar upper surface. The planar upper surface may be exposed to outside the light conversion device 100 by the penetration portion 111. That is, the first organic layer 150 covers both the region at which the light conversion layer 130 and the first inorganic layer 140 are protruded from the substrate 120, and other remaining (e.g., non-protruded) regions, so to provide a planarization layer within the light conversion device 100. Thereby, when an impact is applied on the light conversion device 100, stress generated by the impact may be less focused onto the first inorganic layer 140 and the light conversion layer 130 which are relatively protruded from the substrate 120.

In an embodiment, for example, a relatively fine pattern (not shown) having a variety of shapes and disposition structures may be provided on or defined by the upper surface of the first organic layer 150 in order to improve light extraction in the light conversion device 100.

In an embodiment, the first organic layer 150 may include a light dispersing particle (not shown) therein, or a layer including light dispersing particles (not shown) may be further provided on the upper surface of the first organic layer 150. In this case, the light converted in the light conversion layer 130 and transmitted to and through the first organic layer 150 may be scattered and emitted in various directions after passing through the first organic layer 150.

The light conversion device 100 according to one or more embodiment includes a relatively inexpensive frame 110 having excellent durability and oxygen or moisture blocking properties, compared to the glass capillary of a conventional light conversion device, since the light conversion layer 130 is disposed in the frame 110 and sealed using the first inorganic layer 140 and the first organic layer 150.

In addition, by using the frame 110 having excellent formability as compared to the glass container of the conventional light conversion device, the light conversion device 100 according to one or more embodiment has excellent formability.

In addition, the light conversion device 100 according to one or more embodiment has excellent photo-efficiency by including quantum dots having excellent color purity and color reproducibility.

Hereinafter, a method of manufacturing a light conversion device according to an embodiment is described.

First, prepared is a frame 110 including a penetration portion 111 in a first direction D1 and a wall 112 which is around and/or defines the penetration portion 111.

A substrate 120 having a planar shape corresponding to the penetration portion 111 is prepared, and a light conversion layer 130 is provided on the substrate 120. The substrate 120 may be prepared separate from the frame 110. The light conversion layer 130 may be obtained by coating a quantum dot 131-included resin on the substrate 120 according to a slot die coating, a gravure coating, a comma coating, or the like and curing the same; or adhering the preliminarily cured quantum dot-included light conversion strip onto the substrate 120.

Then the substrate 120 having the light conversion layer 130 thereon is inserted into the frame 110 through the penetration portion 111 thereof. The inserted substrate 120 having the light conversion layer 130 thereon is disposed to position the light conversion layer 130 on an upper (surface) side of the substrate 120. The inserted substrate 120 having the light conversion layer 130 thereon may be disposed in a plane substantially perpendicular to the first direction D1 and then fixed onto the wall 112 of the frame 110. The fixed substrate 120 having the light conversion layer 130 thereon partitions the penetration portion 111 of the frame 110 into an upper space of the penetration portion 111 and a lower space of the penetration portion 111; and the light conversion layer 130 is placed in the upper space of the penetration portion 111. The upper and lower spaces may have a respective boundary defined between the substrate 120 and distal ends of the wall 112 extending in the first direction D1 and the direction opposite to the first direction D1.

According to the light conversion device manufacturing method according to one or more embodiment, a quantum dot 131-included resin is coated on a substrate 120 and cured to provide a light conversion layer 130. On the substrate 120 having the light conversion layer 130 thereon, a first inorganic layer 140 and a first organic layer 150 are sequentially coated and cured. Since the quantum dot 131-included resin in the frame 110 is cured prior to disposing other layers such as the first inorganic layer 140 and the first organic layer 150 thereon, volume expansion of the light conversion layer 130 or gas generation thereof is reduced or effectively prevented, unlike the glass capillary type light conversion device.

However, an embodiment is not necessarily limited to the order of the above-described method processes. In an embodiment, a substrate 120 may be first inserted into a frame 110, and a light conversion layer material such as a strip may be disposed on or adhered to the substrate 120 and then cured. The light conversion layer strip may be obtained by coating a quantum dot 131-included resin onto the previously inserted substrate 120 according to the slot die coating, the gravure coating, the comma coating, or the like and then cured; or may be obtained by first curing light conversion layer material to form a cured quantum dot-included strip and then adhering the preliminarily cured quantum dot-included strip to the substrate 120.

The first inorganic layer 140 is provided on the light conversion layer 130 on the substrate 120 by a sputtering or a chemical vapor deposition ("CVD"), or a solution process in which silicon oxide, titanium oxide-including inorganic material solution is covered on the substrate 120 having the light conversion layer 120 thereon. The first inorganic layer 140 is at least covered on the whole exposed surface of the light conversion layer 130 and also contacts the substrate 120 and the wall 112. Accordingly, the first inorganic layer 140 may block the transportation of oxygen or moisture between the upper space of the penetration portion and the lower space of the penetration portion where are partitioned by the substrate 120.

The first organic layer 150 is provided through a process such as a solution process of covering an organic material solution on the first inorganic layer 140. The first organic layer 150 may be obtained to completely contact the substrate 120 and the wall 112. In addition, in the manufacturing method of the light conversion device according to an embodiment, the upper surface of the first organic layer 150 may be a planar surface.

A method of manufacturing a light conversion device according to one or more embodiment may provide a light conversion device 100 through relatively simple processes, as compared to a method of manufacturing the glass capillary type conversion device since the method of manufacturing the glass capillary type conversion device has complicated conditions from the injection process of the quantum dot-included resin to the curing process. That is, one or more embodiment may provide a light conversion device through the relatively simple process since such method simplifies the processes from a disposing process of the quantum dot-included resin to the curing process thereof.

In addition, to provide mass-producibility, the light conversion device manufacturing method according to one or more embodiment includes the relatively inexpensive substrate and first organic layer 150 having excellent compatibility, as compared to the conventional light conversion device manufacturing method which uses a relatively expensive glass capillary having a microns-sized microtubule therein.

Hereinafter, modified embodiments of the light conversion device 100 are described with reference to FIGS. 4 to 11. The detailed descriptions for the same components as in the light conversion device 100 according to the previous embodiment will be omitted hereinafter.

Figure 4:
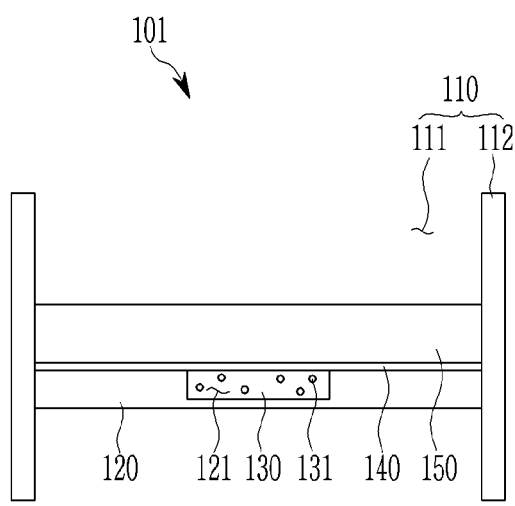
FIGS. 4 to 7, 8A, 8B and 9 to 11 are cross-sectional views respectively showing a light conversion device according to modified embodiments.

FIG. 4 is a cross-sectional view showing a light conversion device according to a modified embodiment. In the light conversion device 101 according to the modified embodiment of FIG. 4, a concave portion 121 is provided recessed from the upper surface of a substrate 120, and a light conversion layer 130 may be filled in at least one portion of the concave portion 121. An upper surface of the light conversion layer 130 may be coplanar with the upper surface of the substrate 120 from which the concave portion 121 is recessed.

In the light conversion device 101 according to the modified embodiment of FIG. 4, unlike the light conversion device 100 of FIG. 1, the light conversion layer 130 is not protruded from the upper surface of the substrate 120, so both the first inorganic layer 140 covering the light conversion layer 130 and the first organic layer 150 disposed or formed on the first inorganic layer 140 are planar layers.

As in the light conversion device 101 according to the modified embodiment of FIG. 4, when the substrate 120 includes the concave portion 121 to accommodate a light conversion layer 130 therein, the exposed region where outer surfaces of the recessed light conversion layer 130 are exposed to the outside is reduced relative to the protruded light conversion device 100 of FIG. 1, so the light conversion layer 130 may be effectively protected from moisture and oxygen. Also, in a method of manufacturing a light conversion device, when the light conversion layer 130 is obtained by providing the concave portion 121 in the substrate 120, the region at which the light conversion layer 130 is to be formed is guided by the concave portion 121, so that the time and effort for providing material of the light conversion layer 130 on the substrate 120 may be saved.

In the modified embodiment of FIG. 4, the substrate 120 may be a polymer substrate. That is, the substrate 120 may include polyolefin, polyester, polyimide, polycarbonate, polyethersulfone, thiol-ene polymer, a cross-linked or uncross-linked (meth)acrylate polymer, a melamine(meth) acrylate polymer, polyepoxy, an epoxy(meth)acrylate polymer, an organic silicone polymer, a silicon(meth)acrylate polymer, a polyurethane(meth)acrylate polymer, a vinyl polymer, or a combination thereof. When the substrate 120 includes or is formed with polymer, fabrication and processing (e.g., shaping) of the substrate 120 is relatively easy and saves cost, resulting in improved mass production, as compared to fabrication and processing of the glass or metal oxide substrate.

Figure 5:
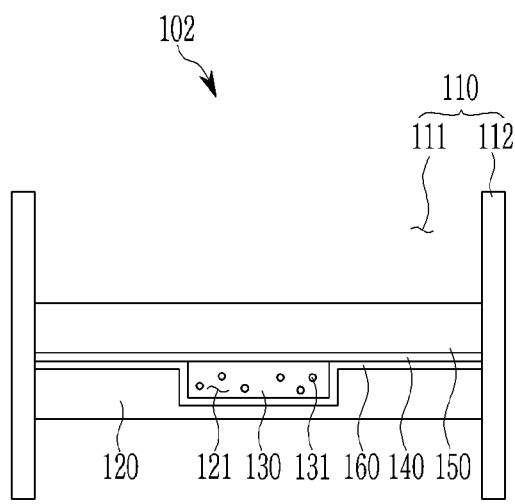

FIG. 5 is a cross-sectional view showing a light conversion device according to another modified embodiment. In the light conversion device 102 according to the modified embodiment of FIG. 5, a concave portion 121 is defined or formed recessed from the upper surface of a substrate 120, and a light conversion layer 130 is filled in at least one portion the concave portion 121. Also, a second inorganic layer 160 may be interposed between the substrate 120 and the light conversion layer 130. The second inorganic layer 160 may directly contact the entirety of the lower surface and side surfaces of the light conversion layer 130.

The second inorganic layer 160 is optically transparent and contacts the wall 112 of the frame 110 to seal the light conversion layer 130. A first inorganic layer 140 is formed to cover both the second inorganic layer 160 and the light conversion layer 130, and a first organic layer 150 is provided on the first inorganic layer 140.

The second inorganic layer 160 may include or be made of an inorganic material including a silicon oxide, a silicon nitride, an aluminum oxide, a titanium oxide, an indium oxide, a tin oxide, an indium tin oxide, a tantalum oxide, a zirconium oxide, a niobium oxide or a combination thereof. The second organic layer 160 may be a layer of the same material of the first inorganic layer 140 or a different material from the first organic layer 150.

By forming the concave portion 121 in the substrate 120, a thickness of the region of the substrate 120 at the concave portion 121 is smaller than a remaining portion of the substrate 120 which is adjacent to the concave portion 121. At the thinner region of the substrate 120 under the concave portion 121, oxygen or moisture may be permeated through the substrate 120. Therefore, the second inorganic layer 160 may be disposed or formed in the concave portion 121 under the light conversion layer 130 and extended onto the upper surface of the substrate 120 from which the concave portion 121 is recessed.

That is, the light conversion device 102 according to the modified embodiment of FIG. 5 is sealed by surrounding all surfaces of the light conversion layer 130 by the first and second inorganic layers 140 and 160, permeation of oxygen or moisture from the upper space of the penetration portion 111 and the lower space of the penetration portion 111 to the light conversion layer 130 is reduced or effectively prevented.

In the modified embodiment of FIG. 5, the substrate 120 may be a polymer substrate, as described for the modified embodiment of FIG. 4. When the substrate 120 includes or is made of polymer material, fabrication and processing (e.g., shaping is relatively easy and also saves the cost, resulting in improved mass production, as compared to fabrication and processing of the glass or metal oxide substrate.

Figure 6:
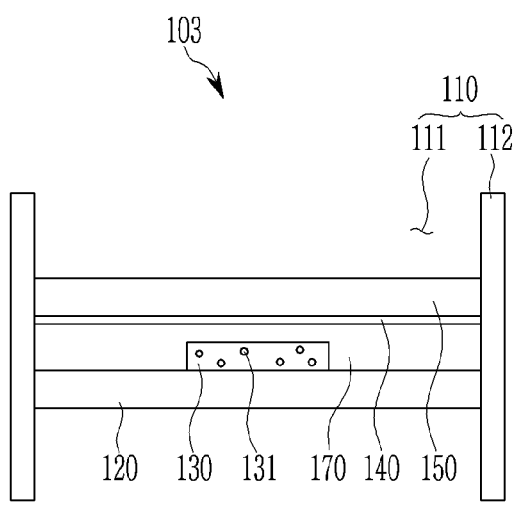

FIG. 6 is a cross-sectional view showing a light conversion device according to still another modified embodiment. In the light conversion device 103 according to the modified embodiment of FIG. 6, a second organic layer 170 may be interposed between a light conversion layer 130 and a first inorganic layer 140.

The second organic layer 170 is optically transparent and may contact the wall 112 of the frame 110 to seal the light conversion layer 130. The second organic layer 170 is disposed or formed to cover the whole light conversion layer 130 while the upper surface of the second organic layer 170 is planarized, and a first inorganic layer 140 and a first organic layer 150 are sequentially stacked thereon. The second organic layer 170 may directly contact the entirety of the upper surface and side surfaces of the light conversion layer 130.

The second organic layer 170 may include or be made of an organic material including a thiol-ene polymer, an organic silicone polymer, a vinyl polymer, polyimide, polyethylenenaphthalate, polyethyleneterephthalate, polyarylate, polycarbonate, epoxy, polyetherimide, polyethylene, polyacrylate, polyethersulfone, or a combination thereof. The thiol-ene polymer refers to a polymerization product of a monomer mixture including a first monomer having at least two thiol group (—SH) at the terminal end and a second monomer having at least two carbon-carbon unsaturated bonds at the terminal end.

The second organic layer 170 may be a layer of the same material of the first organic layer 150 or a different material from the first organic layer 150.

The second organic layer 170 includes or is made of an organic material having excellent compatibility with the substrate 120, the frame 110 and the light conversion layer 130, so the adhesion force thereof to the substrate 120, the frame 110 and the light conversion layer 130 is enhanced relative to an inorganic material.

In addition, in view of reduced sputtering efficiency of the first inorganic layer 140 on the substrate 120 and reduced stability of the obtained first inorganic layer 140 relative to the substrate, in a method of manufacturing a light conversion device, the second organic layer 170 is first formed on the substrate, and the first inorganic layer 140 is formed on the second organic layer 170 such as by sputtering, as compared to where the first inorganic layer 140 is firstly formed on the substrate 120 by sputtering.

That is, the light conversion device 103 according to the modified embodiment of FIG. 6 may improve the stability and the sputtering efficiency of the first inorganic layer 140 within the light conversion device 103 and provide the moisture and oxygen blocking properties by the additional sealing layer of the second organic layer 170.

Figure 7:
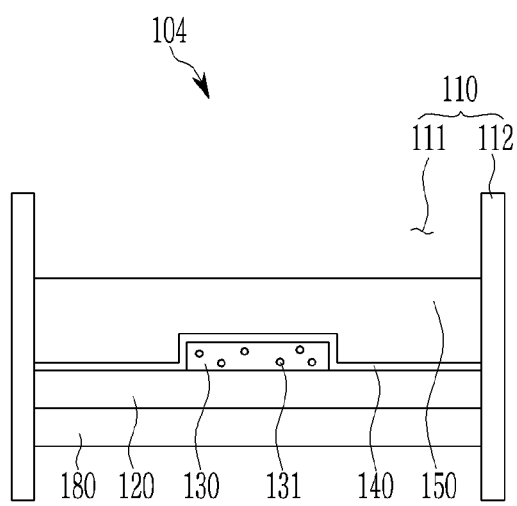

FIG. 7 is a cross-sectional view showing a light conversion device according to yet another modified embodiment. In the light conversion device 104 according to the modified embodiment of FIG. 7, a transparent layer 180 is disposed or formed under the substrate 120. The transparent layer 180 may fill a part or the whole of a gap between the substrate 120 and the lowermost part of the penetration portion 111.

The transparent layer 180 may be exposed to outside the light conversion device 104 at the lower side of the light conversion device 104.

The transparent layer 180 may have a cross-sectional thickness (in the first direction D1) of, for example, greater than or equal to about 50 μm, for example, greater than or equal to about 80 μm, for example, greater than or equal to about 0.1 mm, for example, greater than or equal to about 1 mm and, for example, less than or equal to about 20 mm, for example, less than or equal to about 10 mm, for example, less than or equal to about 5 mm, for example, less than or equal to about 2 mm. The thickness of the transparent layer 180 may be a maximum distance between upper and lower surfaces thereof in the first direction D1.

When the transparent layer 180 has the thickness within the above-described ranges, the incident light entered from the lowermost part of the frame 110, through the transparent layer 180 and to the substrate 120, is dispersed to uniformly enter an entirety of the substrate 120. That is, by enhancing the light uniformity of light entering into the substrate 120, the overall light reliability of the light conversion device 100 may be improved.

If the transparent layer 180 partially fills the gap between the substrate 120 and the lowermost part of the penetration portion 111, the light reliability of the light conversion device 104 may be improved due to the transparent layer 180, and simultaneously, the photo-efficiency of the light conversion device 100 may be improved due to a reduced gap.

That is, as the light conversion device 104 according to the modified embodiment of FIG. 7 includes the transparent layer 180 filling a part or the whole of the gap defined by the substrate 120 and the distal ends of the wall 112, which reduces the overall gap, the photo-efficiency and/or the light reliability of the light conversion device 104 may be improved.

Figure 8A:
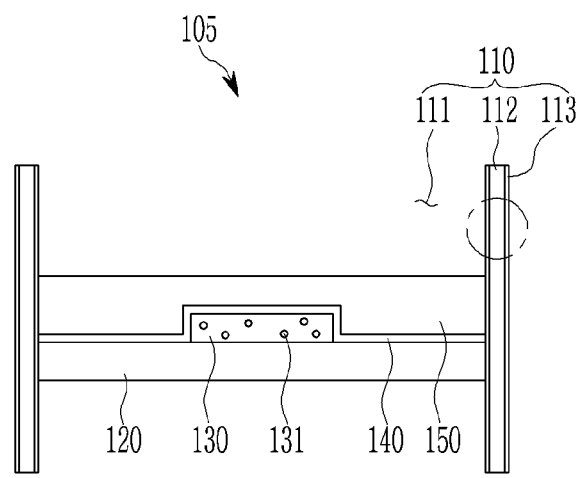
Figure 8B:
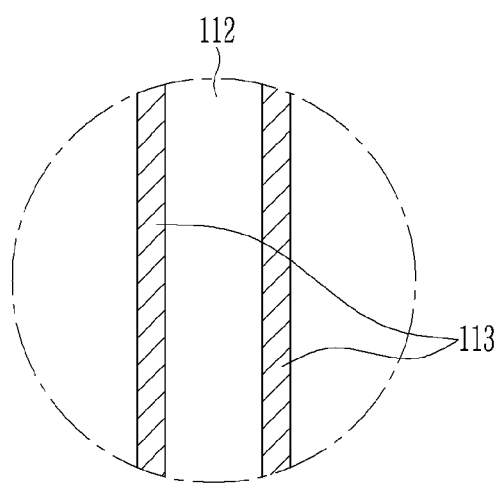

FIGS. 8A and 8B are cross-sectional views each showing a light conversion device according to yet another modified embodiment. FIG. 8B is an enlarged view of the wall at the circled portion in FIG. 8A. In the light conversion device 105 according to the modified embodiment of FIGS. 8A and 8B, a light reflection layer 113 is disposed or formed on a surface of the frame 110. At both of opposing wall portions (e.g., left and right in FIG. 8A), the light reflection layer 113 may be disposed or formed at both the inside of the frame 110 where the penetration portion 111 is positioned and the outside of the flame 110, or may be disposed or formed at only the inside of the frame 110.

In an embodiment of a method of manufacturing a light conversion device, the light reflection layer 113 may be obtained by coating a reflective material such as reflective paint on the inner surface or both the inner and outer surfaces of the frame 110, and then curing the same.

The light reflection layer 113 may have a light reflectance of, for example, greater than or equal to about 95%, for example, greater than or equal to about 90%, for example, greater than or equal to about 80%, for example, greater than or equal to about 70%, for example, greater than or equal to about 50%, for example, greater than or equal to about 30%.

As a quantum dot 131 uniformly emits light in a predetermined wavelength range in all directions while being excited by incident light thereto and then stabilized, some light loss may occur. However, as the light reflection layer 113 of the light conversion device 105 according to the modified embodiment of FIGS. 8A and 8B reflects the light emitted from quantum dots 131 and recycles the same, the light loss may be minimized through the light recycling within the frame 110.

In addition, since light reflection layer 113 of the light conversion device 105 reflects the light emitted from quantum dots 131 and recycles the same, incident light that is emitted to outside the light conversion device 105 without being incident on or passing through the quantum dots 131 according to the incident light angle is minimized, so relatively high light conversion efficiency may be maintained even if using small amount of quantum dots 131 within the light conversion device 105.

That is, in the light conversion device 105 according to the modified embodiment of FIGS. 8A and 8B, the photo-efficiency of the light conversion layer 130 may be improved by providing a light reflection layer 113 on the surface of the frame 110.

Figure 9:
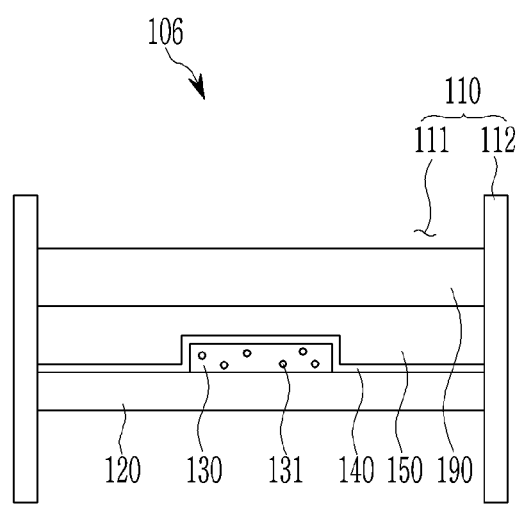

FIG. 9 is a cross-sectional view showing a light conversion device according to yet another modified embodiment. In the light conversion device 106 according to the modified embodiment of FIG. 9, a cover layer 190 is provided on the first organic layer 150. With the cover layer 190 on the first organic layer 150, the first organic layer 150 is not exposed to outside the light conversion device 106 at the upper side of the light conversion device 106.

The cover layer 190 may be disposed facing the substrate 120 with respect to the light converting layer 130, the first inorganic layer 140 and the first organic layer 150. The cover layer 190 is disposed in a plane substantially perpendicular to the first direction D1 and fixed at such position. With reference to the substrate 120 and the cover layer 190, a light conversion layer 130, a first inorganic layer 140 and a first organic layer 150 are interposed between the substrate 120 and the cover layer 190 to provide a sealed sandwich structure.

The cover layer 190 is optically transparent, and may include or be made of a material including glass, metal oxide, polyolefin, polyester, polyimide, polycarbonate, polyethersulfone or a combination thereof. The cover layer 190 and the substrate 120 may include or be made of the same material as each other or different materials from each other.

The cover layer 190 may act as a cover window which covers and protects the first inorganic layer 140 and the first organic layer 150 from extraneous physical and/or chemical influences. That is, even if the light conversion device 106 according to the modified embodiment of FIG. 9 is exposed to relatively severe environments such as rain, or wild migration or movement, the cover layer 190 may protect the first inorganic layer 140 and the first organic layer 150 from the extraneous physical and/or chemical influences.

Figure 10:
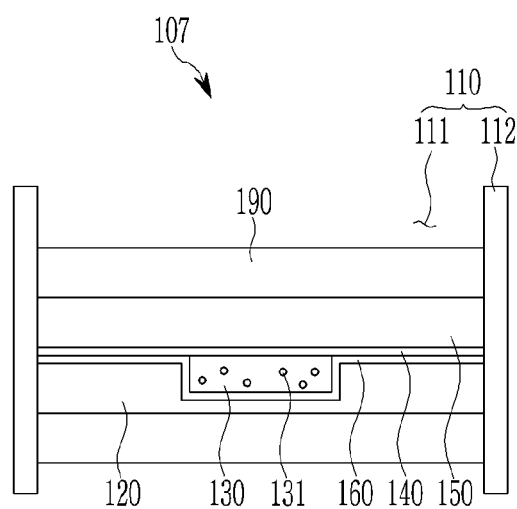
Figure 11:
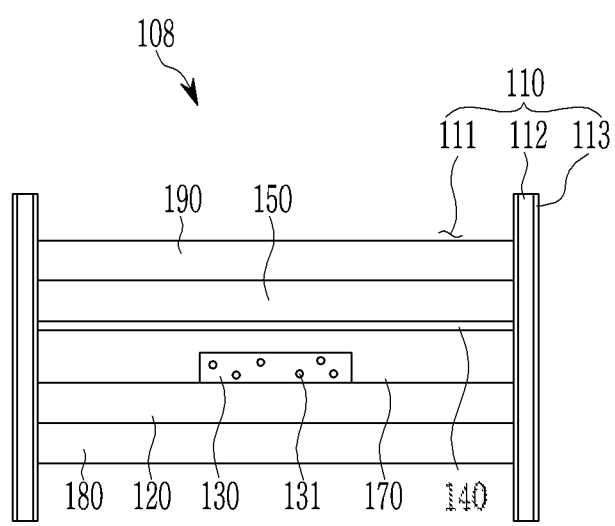

Among the light conversion devices in the various embodiments in FIGS. 3 to 7, 8A and 8B, and 9, two or more structures from these embodiments may be applied to additional embodiments, as discussed for FIGS. 10 and 11.

FIG. 10 is a cross-sectional view showing a light conversion device according to yet another modified embodiment including two or more structures of the previous embodiments in FIGS. 3 to 7, 8A and 8B, and 9. Since the structures in the modified embodiment of FIG. 10 are the same as those of the embodiments in FIGS. 3 to 7, 8A and 8B, and 9, repeated description is omitted for convenience.

The light conversion device 107 according to the modified embodiment of FIG. 10 may all include a concave portion 121 defined or formed in a substrate 120, a light conversion layer 130 filling the concave portion 121, a second inorganic layer 160 interposed between the substrate 120 and the light conversion layer 130, a transparent layer 180 disposed under the substrate 120, and a cover layer 190 disposed on the first organic layer 150.

FIG. 11 is a cross-sectional view showing a light conversion device according to yet another modified embodiment including two or more structures of the previous embodiments in FIGS. 3 to 7, 8A and 8B, and 9. Since the structures in the modified embodiment of FIG. 11 are the same as those of the embodiments in FIGS. 3 to 7, 8A and 8B, and 9, repeated description is omitted for convenience. The light conversion device 108 according to the modified embodiment of FIG. 11 may include all off a second organic layer 170 interposed between a light conversion layer 130 and a first inorganic layer 140, a transparent layer 180 under the substrate 120, a cover layer 190 disposed on the first organic layer 150, and a light reflection layer 113 disposed on the surface of the frame 110.

As described above, the light conversion devices 100 to 108 according to one or more embodiment and numerous variations of such embodiments may show excellent durability, oxygen or moisture blocking properties, formability and photo-efficiency, as compared to the conventional glass capillary type light conversion device.

Hereinafter, a light source module including the light conversion device according to an embodiment is described, referring to FIG. 12.

Figure 12:
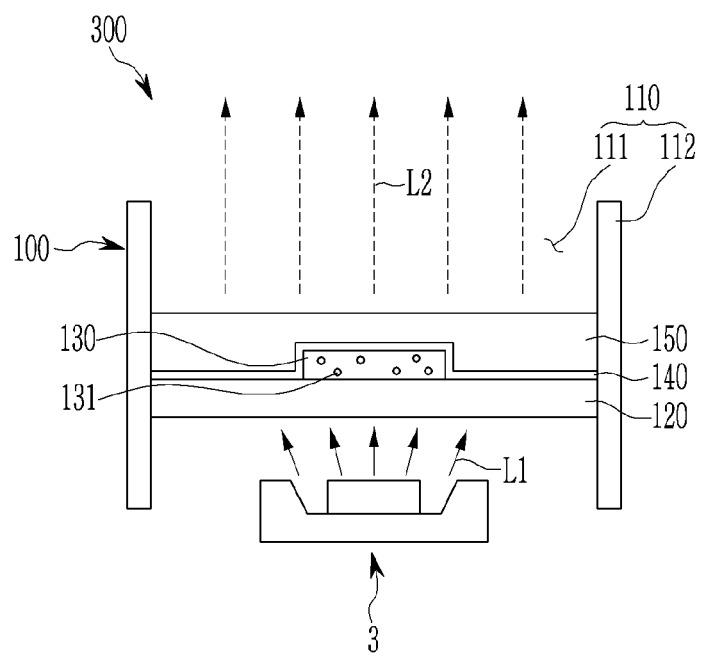
FIG. 12 is a cross-sectional view showing a light source module including a light conversion device according to an embodiment.

FIG. 12 is a view showing a light source module including the light conversion device according to an embodiment. As the light conversion device, any one of the previously-described embodiments may be used.

Referring to FIG. 12, a light source module 300 includes an incident light source 3 such as a light emitting device package which generates and emits incident light L1 in a predetermined wavelength range, and a light conversion device 100 which is disposed at a front side (e.g., in a light emission direction) of the light emitting device package 3. The light conversion device 100 converts the incident light L1 to a light L2 and emits the converted light L2 to outside the light source module 300. The light emitting device package 3 is spaced apart from the light conversion device 100 in the first direction D1, leaving a predetermined gap therebetween. The converted light L2 may be in a different wavelength range from that of the incident light L1.

The light emitting device package 3 may include a variety of light sources or light emitting devices. The light emitting device package 3 may be, for example, a light emitting diode ("LED"), or a laser diode ("LD"), but is not necessarily limited thereto.

The light source module 300 may include plural penetration portions 111 defined by the frame 110 and arranged in a length direction (into the page of FIG. 12). The light converter collectively including a substrate 120, a light conversion layer 130, a first inorganic layer 140 and a first organic layer 150 may be disposed in every penetration portion 111.

In an embodiment, the light emitting device package 3 may be disposed in one-to-one correspondence with the penetration portions 111 of the frame 110. That is, the light emitting device package 3 may be disposed in one-to-one correspondence with the light converters each including the substrate 120, the light conversion layer 130, the first inorganic layer 140 and the first organic layer 150, but is not limited thereto. In an embodiment, incident light from a same one light emitting device package 3 may be entered to at least two penetration portions 111 using the same one light emitting device package 3.

According to an embodiment, the incident light L1 emitted from the light emitting device package 3 may be blue light, and the emitted light L2 converted within the light conversion device 100 and finally emitted from the light source module 300 may be white light. That is, blue light entered into the light conversion device 100 is converted to green light and red light by a green quantum dot and a red quantum dot, respectively, in the light conversion layer 130. The converted green light and red light are mixed with incident blue light which is transmitted without passing through the quantum dot 131, and the mixed light is finally emitted as white light, but embodiments are not necessarily limited thereto.

In an embodiment, the incident light L1 emitted from the light emitting device package 3 and the converted light L2 converted by the light conversion device 100 to be finally emitted from the light source module 300 may be variously adjusted. In other words, for example, the light conversion layer according to an embodiment may be adjusted to emit white light by associating green quantum dots with a red phosphor or associating red quantum dots with a green phosphor; or to finally emit white light by including a phosphor emitting magenta, cyan or yellow light besides the green quantum dot and the red quantum dot.

The light source module 300 according to an embodiment includes the light conversion device according to one or more embodiment described above, so the photo-efficiency of the light source module is excellent. In addition, as the light conversion device according to the one or more embodiment described above has excellent formability, various shapes such as a curved line, a wave, a sawtooth shape, etc. may be provided for the light conversion device so a light source module 300 having various shapes as including the light conversion device may be provided.

Hereinafter, a backlight unit including the light conversion device according to an embodiment is described with reference to FIG. 13.

FIG. 13 is a cross-sectional view showing a backlight unit including light source module which includes the light conversion device according to an embodiment. As the light conversion device, any one of the previously-described embodiments may be used.

The backlight unit 500 according to an embodiment may include a light emitting device package 3 which generates and emits incident light L1 in a predetermined wavelength range, a light conversion device 100 which is disposed at a front side (e.g., in the light emission direction) of the light emitting device package 3. The light conversion device 100 converts the incident light L1 to a light L2 and emits the converted light L2 to outside the light source module, a light guide 5 which guides the converted light L2 emitted from the light conversion device 100 and incident to the light guide 5, and a reflector 7 which reflects a portion of the guided converted light L2 which is emitted from the light guide 5 towards a rear (lower portion in FIG. 13) of the backlight unit 500 and returning the same to the rear surface of the light guide 5.

The light guide 5 may define a light emitting surface (upper surface from which dotted arrows for L2 are extended, the rear surface opposite to the light emitting surface and side surfaces connected to the light emitting surface and the rear surface to each other. The backlight unit 500 according to an embodiment is an edge type backlight unit for which the light emitting device package 3 and the light conversion device 100 are disposed at a side surface of the light guide 5 and the reflector 7, but not necessarily limited thereto. In an embodiment, the backlight unit may also employed a direct type backlight unit for which the light emitting device package 3 and the light conversion device 100 are disposed at a rear side of the light guide 5, and the light emission direction of the light conversion device 100 is directed towards the rear surface of the light guide 5.

The backlight unit 500 according to an embodiment includes the light conversion device according to one or more embodiment described above, so that the photo-efficiency is enhanced. In addition, due to the light conversion device according to one or more embodiment described above having excellent formability, a backlight unit for a curved display or a portable device as well as a backlight unit for the conventional flat panel display may be easily provided. The backlight unit generates and provides light to a display panel of the display which generates and displays and generates an image with the light from the backlight unit. Referring to FIG. 13, the display panel is disposed above the backlight unit 500 to receive light L2 emitted from the light guide 5.

The light conversion device according to one or more embodiment described above has all excellent durability, oxygen or moisture blocking property, formability and photo-efficiency, the processability thereof is simple relative to that of the glass capillary type light conversion device, and the mass productivity thereof is excellent. In addition, a light source module 300 and a backlight unit 500 each including the light conversion device according to one or more embodiment described above show excellent photo-efficiency and durability, and the light conversion device according to one or more embodiment described above may be employed for a light source module 300 and a backlight unit 500 having various shapes according to the shapes of the light conversion device.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A light conversion device, comprising:
   a frame through which incident light is received from a light source and converted light is emitted from the light conversion device, the frame including:
   an opening which is open in a first direction, through which light of a first color is received from the light source and from which light of a second color different from the first color is emitted from the light conversion device, and
   a wall which surrounds the opening to define the opening, and within the opening surrounded by the wall,
   a substrate which is supported by the wall which surrounds the opening,
   a light conversion layer which is disposed on the substrate and spaced apart from the wall, and
   a sealing layer which is disposed on the light conversion layer, wherein the sealing layer directly contacts the substrate and extends along the substrate to contact the wall which surrounds the opening, to seal the light conversion layer and comprises a first inorganic layer and a first organic layer on the substrate,
   wherein a portion of the opening surrounded by the wall is disposed farther along the first direction from the light conversion layer than the sealing layer.

2. The light conversion device of claim 1, wherein
   the substrate defines a concave portion thereof recessed from an upper surface of the substrate and spaced apart from the wall, and
   the light conversion layer is disposed in the concave portion of the substrate.

3. The light conversion device of claim 2, wherein the sealing layer further comprises a second inorganic layer disposed in the concave portion of the substrate, the second inorganic layer disposing the light conversion layer between the first and second inorganic layers.

4. The light conversion device of claim 3, wherein the second inorganic layer disposed in the concave portion of the substrate directly contacts the substrate, extends onto the upper surface of the substrate and contacts the wall to seal the light conversion layer on the substrate.

5. The light conversion device of claim 3, wherein the second inorganic layer includes silicon oxide, silicon nitride, aluminum oxide, titanium oxide, indium oxide, tin oxide, indium tin oxide, tantalum oxide, zirconium oxide, niobium oxide or a combination thereof.

6. The light conversion device of claim 1, wherein the sealing layer further comprises: a second organic layer between the light conversion layer and the first inorganic layer.

7. The light conversion device of claim 6, wherein the second organic layer directly contacts the substrate and extends along the substrate to contact the wall of the frame which surrounds the opening, to seal the light conversion layer on the substrate.

8. The light conversion device of claim 6, wherein the second organic layer includes a thiol-ene polymer, an organic silicone polymer, a vinyl polymer, polyimide, polyethylenenaphthalate, polyethyleneterephthalate, polyarylate, polycarbonate, epoxy, polyetherimide, polyethylene, polyacrylate, polyethersulfone or a combination thereof.

9. The light conversion device of claim 1, wherein the frame includes a metal, a polyolefin, a polyester, a polyimide, a polycarbonate, a polyethersulfone, a polyethyleneterephthalate, a polyethylene, a polycarbonate, a polyurethane, a polypropylene, an acrylonitrile-butadiene-styrene polymer, a polystyrene or a combination thereof.

10. The light conversion device of claim 9, wherein the frame includes a light reflection layer having light reflectance of greater than or equal to about 70% disposed on an inner surface of the wall which faces the opening of the frame.

11. The light conversion device of claim 1, further comprising:
    a transparent layer disposed under the substrate and opposite to the light conversion layer with respect to the substrate.

12. The light conversion device of claim 11, wherein the transparent layer has a thickness of about 0.1 millimeter to about 5 millimeters.

13. The light conversion device of claim 1, wherein
    the opening in which the sealing layer is disposed is provided in plurality arranged along a length of the frame, and
    the wall comprises a first wall extending along the length of the frame, and a plurality of partitions which each intersect with the first wall to respectively define the plurality of openings together with the first wall.

14. The light conversion device of claim 13, wherein the frame is linearly extended or is curved along the length thereof.

15. The light conversion device of claim 2, wherein the first inorganic layer includes silicon oxide, silicon nitride, aluminum oxide, titanium oxide, indium oxide, tin oxide, indium tin oxide, tantalum oxide, zirconium oxide, niobium oxide or a combination thereof.

16. The light conversion device of claim 2, wherein the first organic layer includes a thiol-ene polymer, an organic silicone polymer, a vinyl polymer, polyimide, polyethylenenaphthalate, polyethyleneterephthalate, polyarylate, polycarbonate, epoxy, polyetherimide, polyethylene, polyacrylate, polyethersulfone or a combination thereof.

17. The light conversion device of claim 1, wherein the substrate is disposed in a plane which is perpendicular to the first direction in which the opening of the frame is open.

18. The light conversion device of claim 1, wherein
the light conversion layer includes a light converting particle which converts the light of the first color to the light of the second color, and
the light converting particle is a quantum dot including a Group II-VI compound, a Group III-V compound, a Group IV-VI compound, a Group IV compound or a combination thereof.

19. The light conversion device of claim 1, further comprising within the opening surrounded by the wall:
a cover layer disposed on the first organic layer and opposite to the light conversion layer with respect to the first organic layer.

20. The light conversion device of claim 1, wherein the first inorganic layer directly contacts the substrate and extends along the substrate to contact the wall which surrounds the opening, to seal the light conversion layer on the substrate.

21. The light conversion device of claim 1, wherein the first organic layer directly contacts the substrate and extends along the substrate to contact the wall which surrounds the opening, to seal the light conversion layer on the substrate.

22. A method of manufacturing a light conversion device, comprising:
preparing a frame through which incident light is received from a light source and converted light is emitted from the light conversion device, the frame including:
an opening which is open in a first direction, through which light of a first color is received from the light source and from which light of a second color different from the first color is emitted from the light conversion device, and
a wall which surrounds the opening to define the opening, and within the opening surrounded by the wall:
providing a light conversion layer which receives the light of the first color from the light source, on a substrate and spaced apart from the wall,
inserting the substrate into the frame through the opening thereof and fixing the inserted substrate to the wall of the frame which surrounds the opening, and
providing a sealing layer comprising a first inorganic layer and a first organic layer on the light conversion layer on the substrate, the sealing layer directly contacting the substrate and extending along the substrate to contact the wall which surrounds the opening, to seal the light conversion layer on the substrate,
wherein
a portion of the opening surrounded by the wall is disposed farther along the first direction from the light conversion layer than both the first inorganic layer and the first organic layer of the sealing layer.

23. The method of claim 22, wherein the fixing of the inserted substrate to the wall of the frame includes disposing the substrate in a plane perpendicular to the first direction in which the opening of the frame is open.

24. The method of claim 22, wherein the providing of the light conversion layer includes:
disposing a light converting particle material including a light converting particle which converts the light of the first color to the light of the second color, on the substrate, and
curing the light converting particle material to form the light conversion layer including the light converting particle on the substrate.

25. A light source module comprising:
a light source which generates and emits light of a first color, and
a light conversion device which is disposed in a light emission direction of the light source, converts the light of the first color to light of a second color different from the first color, and emits the light of the second color,
wherein the light conversion device includes:
a frame including:
a plurality of openings arranged along a length of the frame, each of an opening among the plurality of openings being open along a first direction, through which the light of the first color is received from the light source and from which the light of the second color is emitted from the light conversion device,
a wall comprising a first wall extending along the length of the frame, and a plurality of partitions which each intersect with the first wall to surround and define the opening together with the first wall, and
within the opening surrounded by the wall:
a substrate in the opening and supported by the wall which surrounds the opening,
a light conversion layer which is disposed on the substrate and spaced apart from the wall, the light conversion layer including a light converting particle which receives the light of the first color from the light source converts the light of the first color to the light of the second color, and
a sealing layer which is disposed on the light conversion layer on the substrate and contacts the wall which surrounds the opening, to seal the light conversion layer on the substrate, the sealing layer comprising:
a first inorganic layer disposed on the light conversion layer, and
a first organic layer disposed on the first inorganic layer,
wherein a portion of the opening surrounded by the wall is disposed farther along the first direction from the light conversion layer than both the first inorganic layer and the first organic layer of the sealing layer.

26. The light source module of claim 25, wherein
the light source emits blue light as the light of the first color, and
the light conversion device converts the blue light into white light as the light of the second color different from the first color.

27. A backlight unit comprising:
a light source module which generates and emits converted light; and a light guide which receives the converted light from the light source module and guides the received converted light to be emitted from the backlight unit to a display which generates an image with the emitted light, wherein the light source module comprises:

- a light source which generates and emits light of a first color, and
- a light conversion device which is disposed in a light emission direction of the light source, converts the light of the first color to light of a second color different from the first color, and emits the light of the second color, and the light conversion device comprises:

- a frame including:
  - an opening which is open in a first direction, through which the light of the first color is received from the light source and from which light of the second color is emitted from the light conversion device, and
  - a wall which surrounds the opening to define the opening, and within the opening surrounded by the wall,
- a substrate in the opening and supported by the wall which surrounds the opening,
- a light conversion layer which is disposed on the substrate and spaced apart from the wall, the light conversion layer including a light converting particle which converts the light of the first color to the light of the second color, and
- a sealing layer which is disposed on the light conversion layer on the substrate and comprises a first inorganic layer and a first organic layer on the light conversion layer, the sealing layer directly contacting the substrate and extending along the substrate to contact the wall which surrounds the opening, to seal the light conversion layer on the substrate, wherein a portion of the opening surrounded by the wall is disposed farther along the first direction from the light conversion layer than both the first inorganic layer and the first organic layer.

* * * * *